(12) United States Patent
Hirakoso

(10) Patent No.: US 7,741,831 B2
(45) Date of Patent: Jun. 22, 2010

(54) FREQUENCY COMPONENT MEASURING DEVICE

(75) Inventor: Yohei Hirakoso, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/300,329

(22) PCT Filed: Apr. 26, 2007

(86) PCT No.: PCT/JP2007/059033

§ 371 (c)(1),
(2), (4) Date: Nov. 10, 2008

(87) PCT Pub. No.: WO2007/132660

PCT Pub. Date: Nov. 22, 2007

(65) Prior Publication Data

US 2009/0160429 A1    Jun. 25, 2009

(30) Foreign Application Priority Data

May 17, 2006    (JP)    ............................... 2006-137143

(51) Int. Cl.
  *G01R 23/14*    (2006.01)
  *G01R 23/00*    (2006.01)
(52) U.S. Cl. ................................. 324/76.23; 324/76.19
(58) Field of Classification Search .............. 324/76.19, 324/76.23
See application file for complete search history.

(56) References Cited

U.S. PATENT DOCUMENTS 5,736,845 A * 4/1998 Kosuge .................... 324/76.27
6,861,833 B2 * 3/2005 Miyauchi ................. 324/76.19

FOREIGN PATENT DOCUMENTS

JP    08-105922    4/1996
WO    02/29246    4/2002

* cited by examiner

*Primary Examiner*—Amy He
(74) *Attorney, Agent, or Firm*—patenttm.us

(57) ABSTRACT

It is possible to provide a frequency component measuring device capable of narrowing the range of transmission frequency of a local oscillator, preventing degradation of the level measurement accuracy, and measuring the level of a modulation wave. The device includes: a local oscillator (24) capable of performing sweep in a predetermined frequency range; a mixer (22) for mixing a local oscillation signal outputted from the local oscillator (24) and a measured signal so as to subject the measured signal to a frequency conversion; a plurality of intermediate-frequency filters (44, 46) for extracting and outputting components of different intermediate frequencies from a signal outputted from the mixer (22); and an image removal processing section (66) for performing image removal according to the plurality of intermediate-frequency signals separately outputted from the intermediate-frequency filters (44, 46) corresponding to frequency sweep operations performed by the local oscillator (24) more than once.

7 Claims, 3 Drawing Sheets

FREQUENCY COMPONENT MEASURING DEVICE

TECHNICAL FIELD

The present invention relates to a frequency component measuring device for measuring a frequency component of an input signal to a spectrum analyzer etc.

BACKGROUND ART

A spectrum analyzer has been conventionally known that is adapted to remove an image frequency of an input signal by performing frequency sweep twice (for example, see Japanese Patent Laid-Open No. 08-233875, pp. 3-4, FIGS. 1-2). In this spectrum analyzer, two types of spectrum data are obtained by performing frequency sweep twice by changing the frequency range of an oscillation signal of a local oscillator to be inputted to an external mixer (an Nth order harmonic wave included in an output signal of the local oscillator is used as the oscillation signal), and image removal processing is performed by selecting a smaller data value corresponding to the same frequency.

DISCLOSURE OF THE INVENTION

In the technique disclosed in Japanese Patent Laid-Open No. 08-233875, when frequency sweep is performed twice, two sweep frequencies are set so that intermediate-frequency signals having the same frequency (421 MHz) are created for a measurement object signal fhi to be inputted. For this reason, supposing that a frequency range of the measurement object signal fhi is set from f1 to f2, one of sweep frequency ranges is from (f1−421 MHz) to (f2−421 MHz), and the other of the sweep frequency ranges is from (f1+421 MHz) to (f2+421 MHz), and there has been a problem that a sweep frequency range of the local oscillator is eventually from (f1−421 MHz) to (f2+421 MHz), and it has to be set wider by ±421 MHz than the frequency range of the measurement object signal fhi.

There has been also a problem that selecting the smaller of two types of spectrum data obtained by performing frequency sweep twice means that the smaller of the spectrum data is selected every time for each of frequencies if there is a level change in each of the first and second sweep operations, and the measurement accuracy of a signal level accordingly lowers to degrade the level measurement accuracy.

Further, there has been a problem that, supposing that the measurement object signal fhi is a modulation wave whose signal level changes with time, the smaller of the spectrum data is selected for each of frequencies at two frequency sweep operations, and accordingly an instantaneous level of the modulation wave cannot be measured.

The present invention has been made in views of the circumstances, and an object thereof is to provide a frequency component measuring device capable of narrowing the range of transmission frequency of a local oscillator, preventing degradation of the level measurement accuracy, and measuring the level of a modulation wave.

To solve the problems described above, a frequency component measuring device according to the present invention includes: a local oscillator capable of performing sweep in a predetermined frequency range; a first frequency conversion unit for mixing a local oscillation signal outputted from the local oscillator with a measured signal so as to perform frequency conversion to the measured signal; a plurality of intermediate-frequency filters for extracting components of different intermediate frequencies from a signal outputted from the first frequency conversion unit and outputting it; and an image removal processing unit for performing image removal based on a plurality of intermediate-frequency signals separately outputted from the plurality of intermediate-frequency filters corresponding to each of a plurality of frequency sweep operations performed by the local oscillator. By using the plurality of intermediate-frequency signals outputted from the plurality of intermediate-frequency filters, a sweep frequency range of the local oscillator is widened by a value equivalent to a difference between frequencies of the plurality of intermediate-frequency signals, and thereby a plurality of intermediate-frequency signals necessary for image removal can be created, which allows the range of transmission frequency of the local oscillator to be narrowed compared to a conventional configuration.

Also, the image removal processing unit described above may preferably compare levels of the plurality of intermediate-frequency signals, and select the intermediate-frequency signal obtained from one predetermined frequency sweep operation among the plurality of frequency sweep operations when a difference between the levels is not larger than a predetermined reference value, and in the other cases, select the intermediate-frequency signal having a smaller signal level. Accordingly, only the measured signal detected at one frequency sweep operation can be always used even if levels of two intermediate-frequency signals are unstable, and there is a changing magnitude relation between a plurality of signal levels of the measured signal detected at frequency sweep, which can prevent the measurement accuracy of a signal level from lowering and the level measurement accuracy from degrading.

Also, the frequency component measuring device may preferably further include a second frequency conversion unit for converting in frequency each of the plurality of intermediate-frequency signals described above to output a plurality of intermediate-frequency signals having the same frequency, in which the image removal processing unit may preferably perform image removal using the intermediate-frequency signals outputted from the second frequency conversion unit. Making two intermediate-frequency signals have the same frequency allows processing in a later stage to be simplified.

Further, the local oscillation signal outputted from the local oscillator described above includes a component of an Nth order harmonic wave, where N is an integer of two or more, and the first frequency conversion unit may preferably output a signal formed by mixing the measured signal with the component of an Nth order harmonic wave. Accordingly, using the local oscillator having a low oscillation frequency allows frequency characteristics of the measured signal included in a high-frequency range to be measured.

| Description of Symbols | |
| --- | --- |
| 10, 12 | ATTENUATOR (ATT) |
| 20, 22, 30, 50, 52 | MIXER |
| 24, 32, 54 | LOCAL OSCILLATOR |
| 26, 44, 46 | INTERMEDIATE-FREQUENCY FILTER (IF FILTER) |
| 40, 42, 56 | SWITCH |
| 58 | LOWPASS FILTER (LPF) |
| 60 | DETECTING SECTION |
| 62 | ANALOG-DIGITAL CONVERTER (A/D) |
| 64 | MEMORY |
| 66 | IMAGE REMOVAL PROCESSING SECTION |
| 68 | DISPLAY PROCESSING SECTION |
| 70 | DISPLAY SECTION |
| 80 | CONTROL SECTION |
| 82 | OPERATION SECTION |
| 100 | SPECTRUM ANALYZER |

BEST MODE FOR CARRYING OUT THE INVENTION

Figure 1:
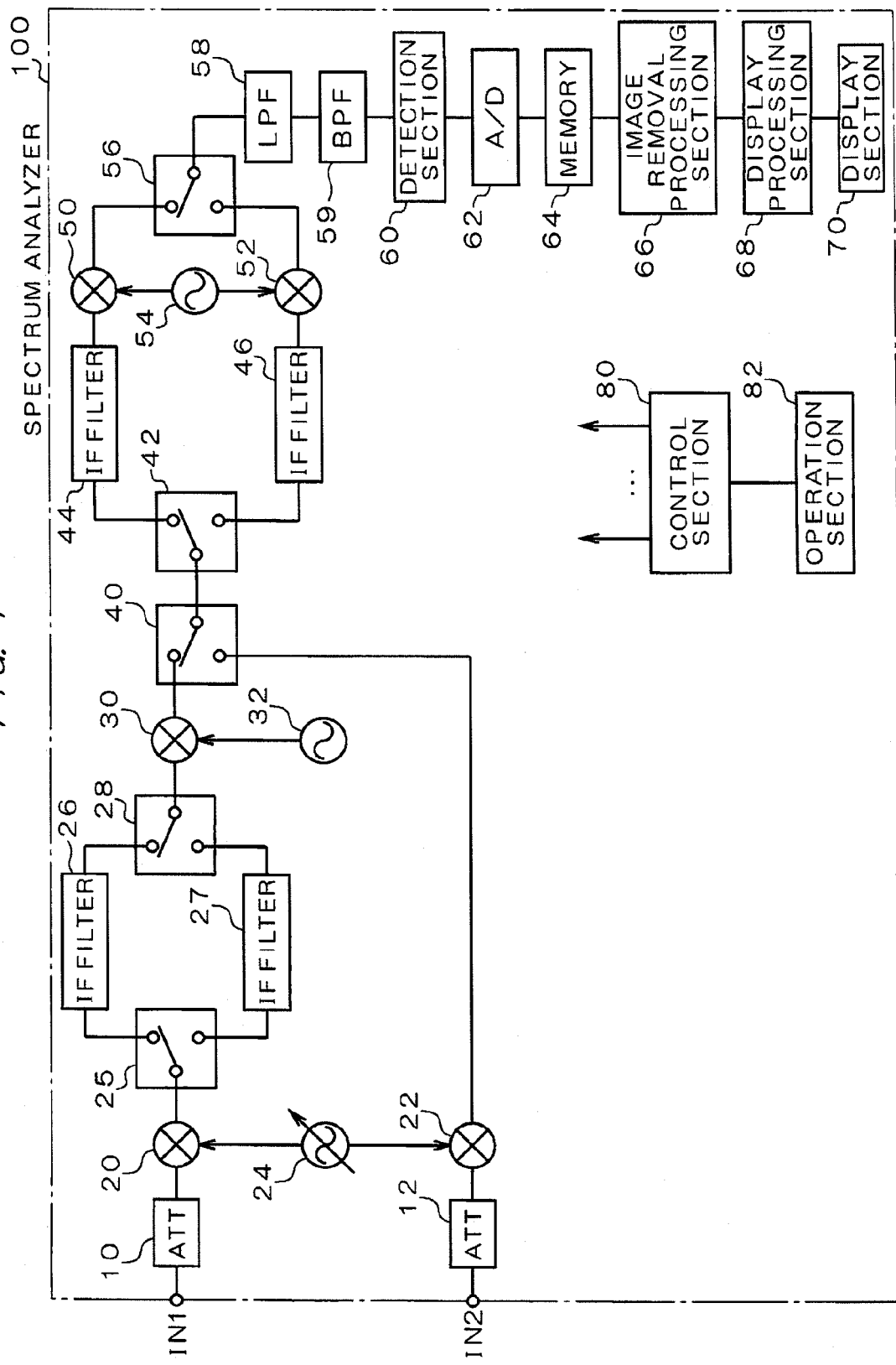
FIG. 1 shows a configuration of a spectrum analyzer according to one embodiment.

Now, a spectrum analyzer as a frequency component measuring device of one embodiment according to the present invention will be described in detail with reference to the drawings. FIG. 1 shows a configuration of a spectrum analyzer of one embodiment. As shown in FIG. 1, the spectrum analyzer 100 according to the present embodiment includes: attenuators (ATT) 10, 12; mixers 20, 22, 30, 50, 52; local oscillators 24, 32, 54; switches 25, 28, 40, 42, 56; intermediate-frequency filters (IF filter) 26, 27, 44, 46; a lowpass filter (LPF) 58; a bandpass filter (BPF) 59, a detecting section 60; an analog-digital converter (A/D) 62; a memory 64; an image removal processing section 66; a display processing section 68; a display section 70; a control section 80; and an operation section 82.

The spectrum analyzer 100 according to the present embodiment includes two input terminals IN1, IN2 to which a signal to be measured (hereinafter referred as the measured signal) is inputted, measures frequency characteristics of the measured signal fin to be inputted to any one of the input terminals IN1, IN2, and displays a spectrum that is the measurement result. The one input terminal IN1 is used to measure the spectrum of a signal in a low-frequency band. For example, to the input terminal IN1, the measured signal fin included in the frequency band of 9 kHz to 8 GHz is inputted. Further, the other input terminal IN2 is used to measure the spectrum of a signal in a high-frequency band. For example, to the input terminal IN2, the measured signal fin included in the frequency band of 8 GHz to 32 GHz is inputted.

The measured signal fin inputted to the input terminal IN1 is made to pass through the attenuator 10 to be adjusted into a predetermined signal level. The mixer 20, to which the measured signal fin of which signal level is adjusted and outputted from the attenuator 10 and a local oscillation signal $f_{ocs1}$ outputted from the local oscillator 24 are inputted, outputs a signal formed by mixing the measured signal fin with the local oscillation signal $f_{osc1}$. The measured signal fin is up-converted (or down-converted) in such a way to produce a signal having a higher frequency (or a lower frequency) than that of the measured signal fin. The local oscillator 24 outputs the local oscillation signal $f_{osc1}$ whose oscillation frequency is capable of sweeping within a predetermined range. The one intermediate-frequency filter 26 is a bandpass filter that passes only the component of a predetermined intermediate frequency (a first intermediate-frequency signal) in the output signal up-converted by the mixer 20. Also, the other intermediate-frequency filter 27 is a bandpass filter that passes only the component of a predetermined intermediate frequency (the first intermediate-frequency signal) in the output signal down-converted by the mixer 20. The switches 25, 28 select any one of the intermediate-frequency filters 26, 27 used to produce the first intermediate-frequency signal by switching connection conditions thereof. Selectively using the two intermediate-frequency filters 26, 27 allows frequency characteristics covering the frequency band of 9 kHz to 8 GHz to be measured. The mixer 30 outputs a signal formed by mixing the first intermediate-frequency signal outputted from the intermediate-frequency filter 26 with a local oscillation signal $f_{ocs2}$ outputted from the local oscillator 32. For example, a frequency difference between the first intermediate-frequency signal and the local oscillation signal $f_{osc2}$ is set to 421 MHz, and the mixer 30 outputs a second intermediate-frequency signal of 421 MHz.

Further, the measured signal fin inputted to the input terminal IN2 is made to pass through the attenuator 12 to be adjusted into a predetermined signal level. The mixer 22, to which the measured signal fin of which signal level is adjusted and outputted from the attenuator 12 and a local oscillation signal $f_{osc3}$ outputted from the local oscillator 24 are inputted, outputs a signal formed by mixing the measured signal fin with the local oscillation signal $f_{osc3}$. In addition, a component of an Nth order harmonic wave included in the output signal of the local oscillator 24 is used as the local oscillation signal $f_{osc3}$. Accordingly, the local oscillation signal $f_{osc3}$ has frequencies N times (N=2, 3, 4, . . . ) the frequency of the local oscillation signal $f_{osc1}$ that is a fundamental frequency component outputted from the local oscillator 24.

The switch 40 selects and outputs any one of the signal outputted from the mixer 30 and the signal outputted from the mixer 22. The switch 42 switches an output destination of the signal selectively outputted from the switch 40 over to any of the intermediate-frequency filters 44, 46. The one intermediate-frequency filter 44 is a bandpass filter having a central frequency of 421 MHz, and extracts a signal of 421 MHz from the signal inputted through the switch 42. The other intermediate-frequency filter 46 is a bandpass filter having a central frequency of 379 MHz, and extracts a signal of 379 MHz from the signal inputted through the switch 42.

The mixer 50 outputs a signal formed by mixing an intermediate-frequency signal outputted from the one intermediate-frequency filter 44 with a local oscillation signal $f_{osc4}$ outputted from the local oscillator 54. Specifically, a frequency of the local oscillation signal $f_{osc4}$ is set to 400 MHz, and the mixer 50 outputs an intermediate-frequency signal of 21 MHz (=421−400 MHz). Also, the mixer 52 outputs a signal formed by mixing an intermediate-frequency signal outputted from the other intermediate-frequency filter 46 with the local oscillation signal $f_{osc4}$ outputted from the local oscillator 54. Because the frequency of the local oscillation signal $f_{osc4}$ is set to 400 MHz, the mixer 50 outputs an intermediate-frequency signal of 21 MHz (=400−379 MHz).

In addition, supposing that frequencies of two intermediate-frequency signals outputted from the two intermediate-frequency filters 44, 46 are f1 and f2, a frequency of the local oscillation signal $f_{osc4}$ outputted from the local oscillator 54 is set to (f1+f2)/2.

The switch 56 selects and outputs any one of a signal outputted from the mixer 50 and a signal outputted from the mixer 52. The lowpass filter 58 passes a low-frequency band component (for example, not greater than 24 MHz) of a signal selected by the switch 56, and filters out a higher-frequency band component than that. The signal outputted from the mixer 50 includes, in addition to a component of 21 MHz that is a difference component between two input signals, also a component of 821 MHz that is a summation component, but the component having a high frequency of 821 MHz is filtered out by the lowpass filter 58. Similarly, the signal outputted from the mixer 52 includes, in addition to a component of 21 MHz that is a difference component between two input signals, also a component of 779 MHz that is a summation component, but the component having a high frequency of 779 MHz is filtered out by the lowpass filter 58. The bandpass filter 59 has a variable bandwidth and is used to set a resolution band width (RBW).

The detecting section 60 detects an output signal from the bandpass filter 59, and the analog-digital converter 62 converts the detected signal into digital data using a predetermined sampling frequency. The digital data is stored in the memory 64. The image removal processing section 66 reads out the digital data stored in the memory 64 to perform image removal processing. Details of the image removal processing will be described below. The display processing section 68 creates a predetermined image of the measurement result including a frequency spectrum etc. in a predetermined display form, based on the digital data after the image removal processing, and displays it on the display section 70. For example, the frequency is displayed in the horizontal axis and the signal level of each of frequency components is displayed correspondingly in the longitudinal axis. In particular, the frequency spectrum is displayed in which the frequency is displayed in the horizontal axis and the signal level of each of frequency components is displayed correspondingly in the longitudinal axis, along with another, additional information.

The control section 80 controls all measurement operations in which the spectrum analyzer 100 is operated. For example, the control section 80 controls frequency sweep operations by the local oscillator 24, switching operations of the switches 40, 42, 56, and timings of starting processing by the image removal processing section 66 and the display processing section 68. The operation section 82 is a device by which a user inputs various instructions. For example, the operation section 82 is used to select a frequency range of the measured signal fin to be inputted (selection of any one of the input terminals IN1, IN2 to which the measured signal fin is inputted) and give an instruction for starting frequency sweep operation to the measured signal fin.

The local oscillator 24 described above corresponds to a local oscillator in each aspect of the present invention, the mixer 22 corresponds to a first frequency conversion unit, and the intermediate-frequency filters 44, 46 correspond to an intermediate-frequency filter in each aspect of the present invention, and the image removal processing section 66 corresponds to an image removal processing unit, and the mixers 50, 52, and the local oscillator 54 correspond to a second frequency conversion unit, respectively.

The spectrum analyzer 100 according to the present embodiment includes such a configuration, and operation thereof will be then described. The case (1) in that the frequency of the measured signal fin is from 9 kHz to 8 GHz, and the case (2) in that the frequency of the measured signal fin is from 8 GHz to 32 GHz will be separately described concerning the operation.

The case (1) in that the frequency of the measured signal fin is from 9 kHz to 8 GHz.

The measured signal fin in this frequency band is inputted to the input terminal IN1. Also, the control section 80 controls the switch 40 to be set on the side of the mixer 30, the switch 42 to be set on the side of the intermediate-frequency filter 44, and the switch 56 to be set on the side of the mixer 50, respectively.

The mixer 20 mixes the measured signal fin outputted from the attenuator 10 with the local oscillation signal $f_{osc1}$ outputted from the local oscillator 24 to output. This signal is made to pass through the intermediate-frequency filter 26 to filter out components included in the signal except frequency components to be measured. A component of an Nth order harmonic wave, in addition to the local oscillation signal $f_{osc1}$ that is a fundamental frequency component, is inputted to the mixer 20 from the local oscillator 24, but a component formed by mixing the component of an Nth order harmonic wave with a signal inputted from the attenuator 10 is entirely filtered out by the intermediate-frequency filter 26. The signal made to pass through the intermediate-frequency filter 26 is inputted to the mixer 30, and a signal formed by mixing this input signal with the local oscillation signal $f_{osc2}$ outputted from the local oscillator 32 is inputted to the intermediate-frequency filter 44 through the switches 40, 42. The intermediate-frequency filter 44 extracts a component near 421 MHz from the input signal to output. This signal is inputted to the mixer 50, and the mixer 50 mixes this input signal with the local oscillation signal $f_{osc4}$ outputted from the local oscillator 54 to convert into a signal of 21 MHz. The output signal from the mixer 50 is outputted through the switch 56, further, processed so that its component in a high-frequency band is filtered out by the lowpass filter 58, detected by the detecting section 60, and quantized (converted into digital data) by the analog-digital converter 62, and then stored in the memory 64. The operations described above continue while performing frequency sweep of the local oscillator 24 from a lower limit frequency to an upper limit frequency (or from the upper limit frequency to the lower limit frequency). The data stored in the memory 64 is read out by the display processing section 68, not via the image removal processing section 66, and an image of the measurement result is displayed on the display section 70.

The case (2) in that the frequency of the measured signal fin is from 8 GHz to 32 GHz The measured signal fin in this frequency band is inputted to the input terminal IN2. Also, the control section 80 controls the switch 40 to be set on the side of the mixer 22, the switch 42 to be set on the side of the intermediate-frequency filter 44, and the switch 56 to be set on the side of the mixer 50, respectively.

Figure 2:
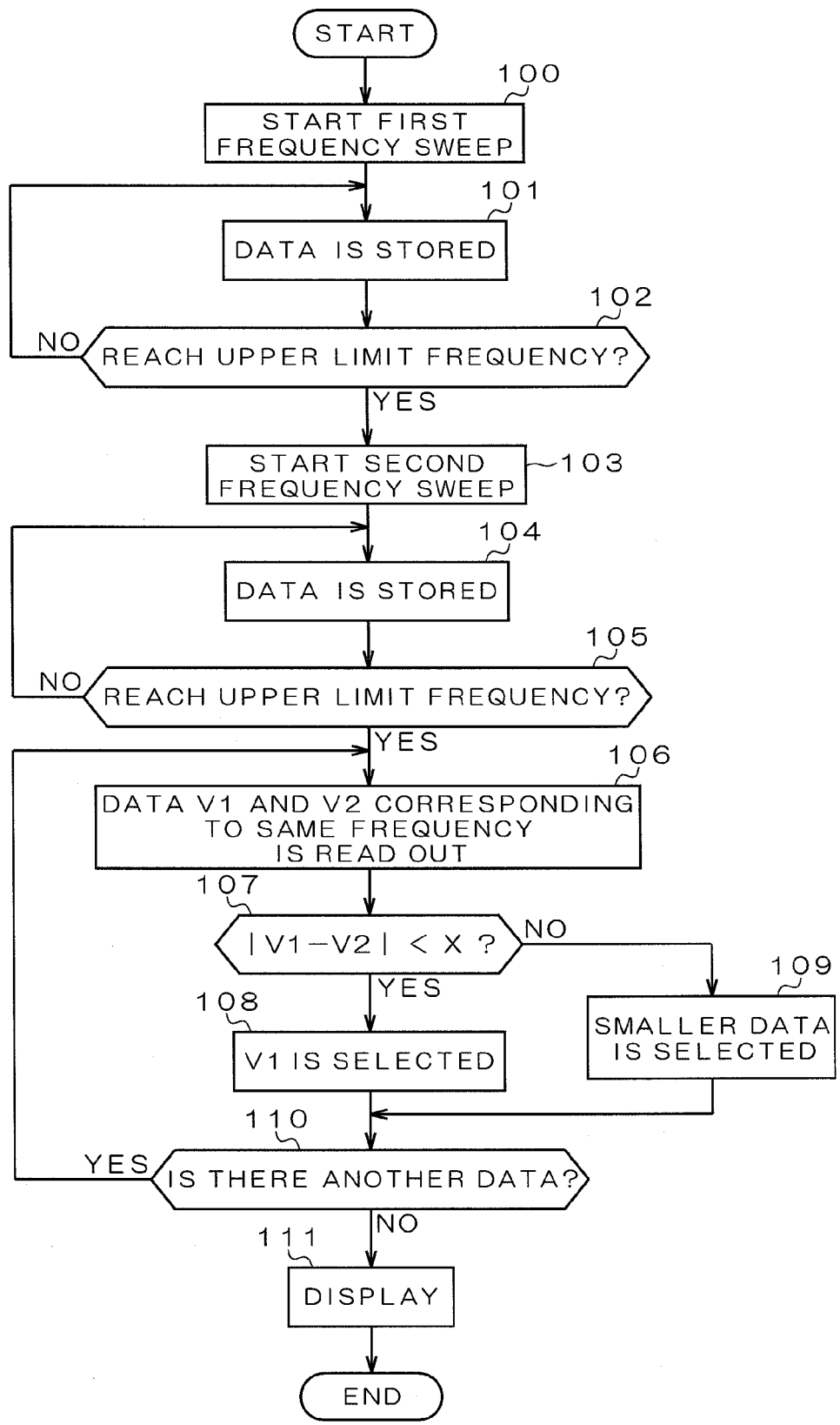
FIG. 2 is a flow chart illustrating operational procedures for measuring frequency of a measured signal fin inputted to an input terminal IN2.

FIG. 2 is a flow chart illustrating operational procedures for measuring frequency of the measured signal fin inputted to the input terminal IN2. First, the control section 80 starts the first frequency sweep by the local oscillator 24 (step 100). In parallel with this frequency sweep operation, a signal outputted from the mixer 22 is inputted to the intermediate-frequency filter 44 through the switches 40, 42, and data outputted from the analog-digital converter 62 corresponding to an output signal from the mixer 50 is taken and stored in the memory 64 (step 101). Also, the control section 80 determines whether the sweep reaches the upper limit frequency or not (step 102), and when it does not reach the upper limit frequency, a negative judgment is provided. In this case, it returns to step 101, and the data continues to be taken in the memory 64. Also, when the sweep reaches the upper limit frequency, an affirmative judgment is provided in determination of step 101.

Next, the control section 80 starts the second frequency sweep by the local oscillator 24 (step 103). In addition, prior to the second frequency sweep operation, the control section 80 controls the switch 42 to be set on the side of the intermediate-frequency filter 46, and the switch 56 to be set on the side of the mixer 52, respectively (the switch 40 remains switched over to the side of the mixer 22).

In parallel with this frequency sweep operation, a signal outputted from the mixer 22 is inputted to the intermediate-frequency filter 46 through the switches 40, 42, and data outputted from the analog-digital converter 62 corresponding to an output signal from the mixer 52 is taken and stored in the memory 64 (step 104). Also, the control section 80 determines whether the sweep reaches an upper limit frequency or not (step 105), and when it does not reach the upper limit frequency, a negative judgment is provided. In this case, it returns to step 104, and the data continues to be taken in the memory 64. Further, when the sweep reaches the upper limit frequency, an affirmative judgment is provided in determination of step 105.

Next, the image removal processing section 66 reads out from the memory 64 two pieces of data V1 and V2 obtained from two frequency sweep operations, corresponding to the same frequency (step 106), and determines whether |V1−V2| is smaller than a reference value X or not (step 107). In addition, the same frequency here does not mean each of sweep frequencies at the two frequency sweep operations by the local oscillator 24, but means each of frequencies in the measured signal fin inputted twice to the input terminal IN2 on performing two frequency sweep operations. This determination is intended to determine whether the data V1 and the data V2 are approximately equal to each other or not, and the reference value X is set to a small value. When the two pieces of data V1 and V2 are approximately equal to each other, and the affirmative judgment is provided in determination of step 107, then the image removal processing section 66 selects the data V1 obtained at the first frequency sweep (the data corresponding to the intermediate-frequency signal outputted from the one intermediate-frequency filter 44), as data corresponding to a frequency on which attention is focused (step 108). Also, when a difference between the two pieces of data V1 and V2 is not smaller than the reference value X, the negative judgment is provided in determination of step 107. In this case, the larger of the two pieces of data is an image, and the image removal processing section 66 selects the smaller of the data V1 and V2 (step 109). Next, the image removal processing section 66 determines whether there is another data or not (step 110). For example, supposing that the image removal processing section 66 reads out the data in order of increasing frequency, the affirmative judgment in determination of step 110 is provided until the sweep reaches the upper limit frequency (32 GHz) of the measurement frequency band, and then it returns to step 106 to repeat read operation of the data V1 and V2. Further, when there is not another data, the negative judgment is provided in determination of step 110, and the display processing section 68 displays an image of the measurement result on the display section 70 (step 111). Accordingly, frequency measurement of the measured signal fin inputted to the input terminal IN2 ends.

Figure 3:
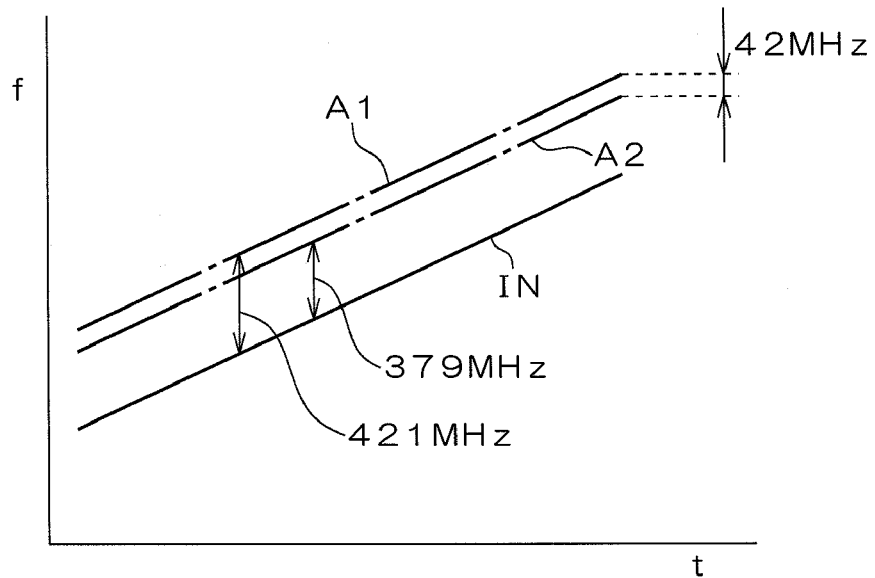
FIG. 3 is an illustration showing two frequency sweep operations necessary for frequency measurement of the measured signal fin inputted to the input terminal IN2.

FIG. 3 is an illustration showing two frequency sweep operations necessary for frequency measurement of the measured signal fin inputted to the input terminal IN2. The horizontal axis shows the sweep time t, and the longitudinal axis shows the frequency f, respectively. Also, frequency characteristics of the local oscillation signal $f_{osc3}$ at the first frequency sweep is shown by the symbol A1, frequency characteristics of the local oscillation signal $f_{osc3}$ at the second frequency sweep is shown by the symbol A2, and frequency characteristics of the measured signal fin corresponding to a component outputted from the intermediate-frequency filter 44 or the intermediate-frequency filter 46 on performing frequency sweep twice is shown by the symbol IN, respectively. In addition, since an Nth order harmonic wave included in the output signal from the local oscillator 24 is used as the local oscillation signal $f_{osc3}$, the number of the frequency characteristics shown by symbols A1 or A2 in FIG. 3 is equal to the number of the Nth order harmonic waves, but the characteristics, for simplification, are shown correspondingly to the second order harmonic wave, where N=2.

As shown in FIG. 3, supposing that the frequency of the local oscillation signal $f_{osc3}$ changes as shown by the symbol A1 at the first frequency sweep, the signal of 421 MHz outputted from the intermediate-frequency filter 44 corresponds to the measured signal fin having a frequency lower (or higher) by 421 MHz than that of the local oscillation signal $f_{osc3}$. That is, sweeping the frequency of the local oscillation signal $f_{osc3}$ allows the frequency characteristics of the measured signal fin to be measured. Similarly, supposing that the frequency of the local oscillation signal $f_{osc3}$ changes, as shown by the symbol A2, at the second frequency sweep, the signal of 379 MHz outputted from the intermediate-frequency filter 44 corresponds to the measured signal fin having a frequency lower (or higher) by 379 MHz than that of the local oscillation signal $f_{osc3}$. Accordingly, the frequency of the local oscillation signal $f_{osc3}$ at the second frequency sweep is set lower by 42 MHz than that of the local oscillation signal $f_{osc3}$ at the first frequency sweep, and thereby two types of intermediate-frequency signals of 421 MHz and 379 MHz corresponding to the same frequency of the measured signal fin are obtained. At this time, a signal component actually present is naturally measured using the same frequency even if the two types of intermediate-frequency signals are used (corresponding to the case in that the affirmative judgment is provided in step 107 in FIG. 2), but the image is measured using a different frequency because the frequency of the local oscillation signal $f_{osc3}$ is shifted by 42 MHz (corresponding to the case in that the negative judgment is provided in step 107 in FIG. 2).

As described above, according to the present embodiment, only by shifting the frequency of the local oscillation signal $f_{osc3}$ by 42 MHz on performing frequency sweep twice, the range of oscillation frequency of the local oscillator 24 can be narrowed.

Figure 4:
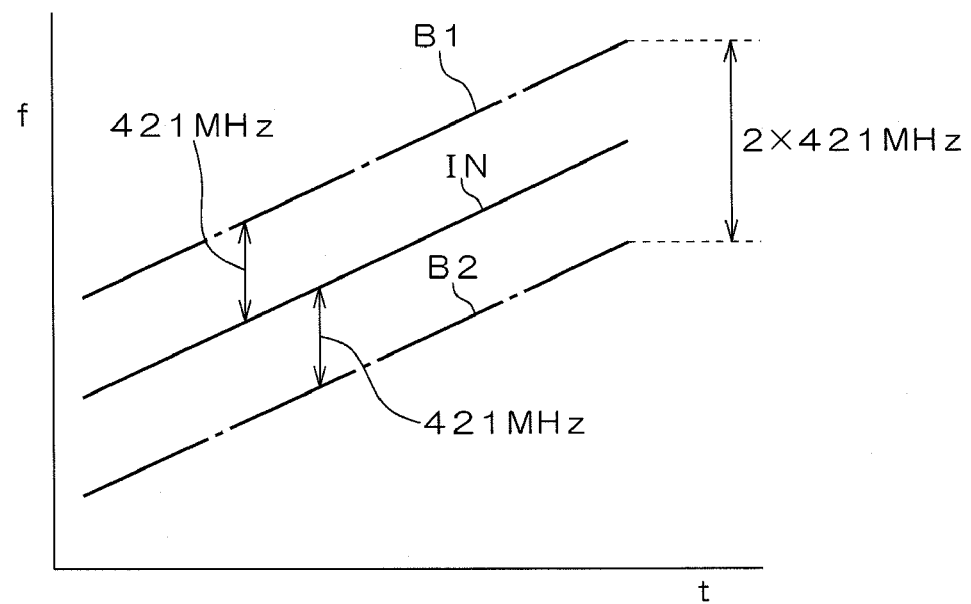
FIG. 4 is an illustration showing two conventional frequency sweep operations.

FIG. 4 is an illustration showing two conventional frequency sweep operations. As shown in FIG. 4, since one type of intermediate-frequency (421 MHz) is conventionally used, a difference between a frequency (B1) of the local oscillation signal $f_{osc3}$ at the first frequency sweep and a frequency (B2) of the local oscillation signal $f_{osc3}$ at the second frequency sweep is 2×421 MHz, and the range of oscillation frequency of the local oscillator becomes wide (actually, in the case in that a second order harmonic wave is used as the local oscillation signal $f_{osc3}$, the range of oscillation frequency does not become wider by 2×421 MHz, but the range may be set wider by half of that, namely 421 MHz).

Also, according to the present embodiment, since, for a signal component actually present, a signal level measured at the first frequency sweep is always selected (corresponding to the operation in step 108 in FIG. 2), signal levels measured in twice frequency sweep operations were not included in the measurement result, which can prevent the level measurement accuracy from degrading due to lowering of the measurement accuracy of the signal level. Accordingly, also, this allows for level measurement of a measured signal fin having a variable signal level with time as a modulation wave.

In addition, the present invention is not limited to the embodiment described above, and various modifications may be made within the range of the spirit and scope of the present invention. In the embodiment described above, by providing the mixers 50, 52, and the local oscillator 54 in the subsequent stage of the intermediate-frequency filters 44, 46, frequencies of intermediate-frequency signals outputted from the two intermediate-frequency filters 44, 46 have been both converted into 21 MHz, but each output of the intermediate-frequency filters 44, 46 may be inputted to the switch 56 to directly select any one of them. In this case, the lowpass filter 58 is adapted to filter out components in a high frequency range not smaller than 421 MHz.

Further, in the embodiment described above, the two intermediate-frequency filters 44, 46 have been used, but three or more intermediate-frequency filters may be provided, and two or more ones may be selectively used as needed. For example, supposing that a frequency range to be measured is variable, when the frequency range is narrow, a combination of intermediate-frequency filters having a frequency comparatively near each other may be used, and conversely, when the frequency range is wide, a combination of intermediate-frequency filters having a frequency comparatively different from each other may be used.

INDUSTRIAL APPLICABILITY

According to the present invention, by using a plurality of intermediate-frequency signals outputted from a plurality of intermediate-frequency filters, the sweep frequency range of a local oscillator is widened by a value equivalent to a frequency difference between the plurality of intermediate-frequency signals, and thereby a plurality of intermediate-frequency signals necessary for image removal can be produced, which can narrow the range of transmission frequency of the local oscillator compared to a conventional configuration.

The invention claimed is:

1. A frequency component measuring device, comprising:
a local oscillator capable of performing sweep in a predetermined frequency range;
a first frequency conversion unit for mixing a local oscillation signal outputted from the local oscillator with a measured signal so as to perform frequency conversion to the measured signal;
a plurality of intermediate-frequency filters for extracting components of different intermediate frequencies from a signal outputted from the first frequency conversion unit and outputting it; and
an image removal processing unit for performing image removal based on a plurality of intermediate-frequency signals separately outputted from the plurality of intermediate-frequency filters corresponding to each of a plurality of frequency sweep operations performed by the local oscillator, wherein
the image removal processing unit compares levels of the plurality of intermediate-frequency signals to select the intermediate-frequency signal obtained from one predetermined frequency sweep operation among the plurality of frequency sweep operations when a difference between the levels is not larger than a predetermined reference value, and in the other cases, selects the intermediate-frequency signal having a smaller signal level.

2. The frequency component measuring device according to claim 1, wherein
the number of the plurality of intermediate-frequency filters is two.

3. The frequency component measuring device according to claim 1, further comprising:
a second frequency conversion unit for performing frequency conversion to each of the plurality of intermediate-frequency signals to output a plurality of intermediate-frequency signals having the same frequency, wherein
the image removal processing unit performs image removal using the intermediate-frequency signals outputted from the second frequency conversion unit.

4. The frequency component measuring device according to claim 3, wherein
the number of the plurality of intermediate-frequency filters is two,
the second frequency conversion unit comprises:
a second local oscillator; and
two mixers for mixing a local oscillation signal outputted from the second local oscillator with two intermediate-frequency signals outputted from the two intermediate-frequency filters, and
supposing that frequencies of the two intermediate-frequency signals outputted from the two intermediate-frequency filters are f1 and f2, the second local oscillator outputs the local oscillation signal having a frequency of (f1+f2)/2.

5. The frequency component measuring device according to claim 1, wherein
the local oscillation signal outputted from the local oscillator includes a component of an Nth order harmonic wave, where N is an integer of two or more, and
the first frequency conversion unit outputs a signal formed by mixing the measured signal with the component of an Nth order harmonic wave.

6. A frequency component measuring device, comprising:
a local oscillator capable of performing sweep in a predetermined frequency range;
a first frequency conversion unit for mixing a local oscillation signal outputted from the local oscillator with a measured signal so as to perform frequency conversion to the measured signal;
a plurality of intermediate-frequency filters for extracting components of different intermediate frequencies from a signal outputted from the first frequency conversion unit and outputting it;
an image removal processing unit for performing image removal based on a plurality of intermediate-frequency signals separately outputted from the plurality of intermediate-frequency filters corresponding to each of a plurality of frequency sweep operations performed by the local oscillator; and
a second frequency conversion unit for performing frequency conversion to each of the plurality of intermediate-frequency signals to output a plurality of intermediate-frequency signals having the same frequency, wherein
the image removal processing unit performs image removal using the intermediate-frequency signals outputted from the second frequency conversion unit,
wherein the number of the plurality of intermediate-frequency filters is two,
the second frequency conversion unit comprises:
a second local oscillator; and
two mixers for mixing a local oscillation signal outputted from the second local oscillator with two intermediate-frequency signals outputted from the two intermediate-frequency filters, and
supposing that frequencies of the two intermediate-frequency signals outputted from the two intermediate-frequency filters are f1 and f2, the second local oscillator outputs the local oscillation signal having a frequency of (f1+f2)/2.

7. The frequency component measuring device according to claim 6, wherein
the local oscillation signal outputted from the local oscillator includes a component of an Nth order harmonic wave, where N is an integer of two or more, and
the first frequency conversion unit outputs a signal formed by mixing the measured signal with the component of an Nth order harmonic wave.

* * * * *